(12) United States Patent
Bonola (10) Patent No.: US 6,460,121 B1
(45) Date of Patent: Oct. 1, 2002

(54) METHOD FOR PROVIDING AN ATOMIC MEMORY READ USING A COMPARE-EXCHANGE INSTRUCTION PRIMITIVE

(75) Inventor: Thomas J. Bonola, Tomball, TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/152,888

(22) Filed: Sep. 14, 1998

(51) Int. Cl.[7] .......................... G06F 12/00; G06F 13/00
(52) U.S. Cl. ..................... 711/154; 711/152; 711/163; 711/164
(58) Field of Search ................... 711/152, 154, 711/163, 164; 713/200, 202

(56) References Cited

U.S. PATENT DOCUMENTS

| 5,243,701 A | * | 9/1993 | Muramatsu et al. | 395/325 |
|---|---|---|---|---|
| 5,442,755 A | * | 8/1995 | Shibita | 395/325 |
| 5,668,971 A | * | 9/1997 | Neufeld | 711/111 |
| 5,995,746 A | * | 11/1999 | Sites et al. | 395/561 |
| 5,995,750 A | * | 11/1999 | Samson et al. | 395/677 |
| 6,128,709 A | * | 10/2000 | Autechaud et al. | 711/151 |

OTHER PUBLICATIONS

Mendel, Brett; "Server I/O all set to flow";*Lantimes*, Oct. 27, 1997, vol. 14, Issue 22; cover page and p. 31.
Briggs, Chris; "Smarter and Faster I/O for Servers", CORE: Operating Systems;*Byte*, May 1, 1996, vol. 2, No. 5.
Thompson, Tom; "I2O Beats I/O Bottlenecks", *Byte*, Aug. 1997, pp. 85, 86 and 3 additional pages.
I2O Introduction; Technology Backgrounder; Aug. 13, 1997; http://www.i2osig.org/Architecture/TechBack.html.
i960®RP I/O Processor—the I2O SIG site; http://134.134.214.1/design/iio/i2osig.html; Feb. 6, 1998.
"Welcome to the I2O SIG® Web Site!"; http://www.i2osig.org; Feb. 6, 1998.
"About I2O Technology"; http://www.i2osig.org/Architecture; Feb. 6, 1998.
"Technology Backgrounder"; http://www.i2osig.org/Architecture/TechBack.html; Feb. 6, 1998; 6 pages.
"Questions and Answers", http:/www.i2osig.org/Architecture/QandA.html;Feb. 6, 1998; 4 pages.

(List continued on next page.)

*Primary Examiner*—Matthew Kim
*Assistant Examiner*—Pierre M. Vital
(74) *Attorney, Agent, or Firm*—Fletcher, Yoder, and Van Someren (57) ABSTRACT

A method for performing an atomic read of a memory cell. A plurality of data parts of the memory cell are loaded into a respective first plurality of registers and an atomic compare and exchange operation is executed on the memory cell. The first plurality of registers is read and concatenated forming a value equal to the value of the memory cell. In a first embodiment, a low-order data part of the memory cell is loaded into registers A and B and a high-order data part of the memory cell is loaded into registers D and C. An atomic compare and exchange operation is executed on the memory cell and register A and register D are read and concatenated. In a second embodiment, the contents of register A is loaded into register B and the contents or register D is loaded into register C. An atomic compare and exchange operation is executed on the memory cell and register A and register D are read and concatenated. In a third embodiment, register A is loaded with a known value wherein the value is known never to exist in the low-order data part of the memory cell and register D is loaded with a value wherein the value is known never to exist in the high-order data part of the memory cell. An atomic compare and exchange operation is executed on the memory cell and register A and register D are read and concatenated.

20 Claims, 4 Drawing Sheets

OTHER PUBLICATIONS

"I2/O® Specifications For Non–Members"; http://www.i2osig.org/Architecture/GetSpec.html; Feb. 6, 1998.

Amdahl, Carlton G.; "I2O Future Directions"; http://www.i2osig.org; Jun. 1996; 12 pages.

Goble, Scott, et al.; "Intelligent I/O Architecture"; http://www.i2osig.org; Jun. 1996; 22 pages.

"Press Releases and Clips"; http://www.i2osig.org/Press; Feb. 6, 1998; 4 pages.

Listing of Press Releases ; http://altavista.digital.com/cgi-bin/quer . . .=21% 2FMar%2F86&d1=&search.x=46&search.y=6; Feb. 6, 1998; 2 pages.

Crothers, Brooke; "Intel server chip gets big backing", Oct. 7, 1997; http://www.news.com/News/Item/0,4,14962,00.html; Feb. 6, 1998.

"HP Demonstrates Commitment to I2O Standard With New I2O Disk–array Controller"; *Hewlett Packard*; Press Release, Atlanta, Oct. 8, 1997; http://hpcc920.external.hp.com/pressrel/oct97/08b.html; Feb. 6, 1998, 2 pages.

"I2O: Disaster in the making for the freeware community"; http://22.kenandted.com/i2o/disaster.html; Feb. 6, 1998; 2 pages.

* cited by examiner

METHOD FOR PROVIDING AN ATOMIC MEMORY READ USING A COMPARE-EXCHANGE INSTRUCTION PRIMITIVE

FIELD OF THE INVENTION

The present invention pertains in general to reading a memory cell in a computer system having a memory shared between multiple processing nodes, and more particularly, but not by way of limitation, to a method for performing a sixty-four bit atomic memory read on a thirty-two bit processor using a sixty-four bit compare-exchange instruction primitive.

BACKGROUND OF THE INVENTION

In a shared memory computing environment wherein a plurality of processing nodes have access to a shared memory cell, many types of situations may arise which can compromise data integrity. One such situation occurs when a processor in one of the processing nodes attempts to read a sixty-four bit memory cell using two, thirty-two bit read operations. Typically, if a processor needs to read the sixty-four bit memory cell, the processor performs a single atomic sixty-four bit memory read operation. In certain situations, however, the processor is unable to perform a single sixty-four bit read operation. Instead, the processor first reads either the low-order thirty-two bits or the high-order thirty-two bits in a first read operation and then reads the remaining high-order thirty-two bits or the low-order thirty-two bits, respectively, in a second distinct read operation.

There are various reasons for the processor to perform two thirty-two bit reads instead of a single sixty-four bit read. For instance, a communication bus used by the processor to access the memory cell may only have the capacity to communicate either the low-order thirty-two bits or the high-order thirty-two bits at a time. In another instance, the communication bus may have the capacity to communicate both the low-order thirty-two bits and the high-order thirty-two bits at the same time but the processor may only have a register, used in the read operation, large enough to store either the low-order thirty-two bits or the high order thirty two bits. In these instances, the processor performs two separate accesses to the memory cell in order to read the entire contents of the memory cell.

A problem arises, however, if a processor other than the processor performing the read operation modifies the contents of the memory cell after the original processor performing the read operation reads the low-order thirty-two bits but before the original processor reads the high-order thirty-two bits. This situation occurs as a result of each processing node operating asynchronously at various speeds with different priorities to access system resources including the memory cell. To prevent this problem from occurring, the processor can be programmed to perform an atomic read operation which locks out other processors from writing to the memory cell until after the reading processor performs both the low-order and high-order reads. There are processors, however, which are not programmed to perform such an atomic read operation.

In situations where the processor must perform a low-order and a high-order read operation and an atomic read operation is unavailable, other methods have been used to perform an atomic read operation. Operating System synchronization techniques have been used as has the implementation of mutual exclusion and semaphore objects to provide an atomic sixty-four bit read operation on two adjacent thirty-two bit data parts. Another method is to utilize floating point registers in the read operation. These methods, however, are either complex or consume a relatively larger number of clock cycles. For example, the use of floating point registers requires that the floating point state be saved and restored to preserve floating state on context switches.

Therefore, it would be advantageous to devise a method to provide a simple mechanism by which an atomic sixty-four bit read operation can be performed in situations where two, thirty-two bit read operations are required.

SUMMARY OF THE INVENTION

The present invention comprises a method for performing an atomic read of a memory cell shared by a plurality of processing nodes. A plurality of data parts of the memory cell are loaded into a respective first plurality of registers and an atomic compare and exchange operation is executed on the memory cell. The first plurality of registers is read and concatenated. The compare and exchange operation results in a value formed by concatenating the first plurality of registers being equal to the value of the memory cell.

In a first embodiment of the present invention, a low-order data part of the memory cell is loaded into registers A and B and a high-order data part of the memory cell is loaded into registers D and C. An atomic compare and exchange operation is executed on the memory cell and register A and register D are read. The contents of the memory cell is equal to a value formed by the concatenation of register D with register A.

In a second embodiment of the present invention, the contents of register A is loaded into register B and the contents or register D is loaded into register C. An atomic compare and exchange operation is executed on the memory cell and register A and register D are read. The contents of the memory cell is equal to a value formed by the concatenation of register D to register A.

In a third embodiment of the present invention, register A is loaded with a known value wherein, the value is known never to exist in the low-order data part of the memory cell and register D is loaded with a value wherein, the value is known never to exist in the high-order data part of the memory cell. An atomic compare and exchange operation is executed on the memory cell and register A and register D are read. The contents of the memory cell is formed by the concatenation of register D with register A.

BRIEF DESCRIPTION OF THE DRAWINGS

A more complete understanding of the present invention may be had by reference to the following Detailed Description and appended claims, when taken in conjunction with the accompanying Drawings wherein:

DETAILED DESCRIPTION

Figure 1:
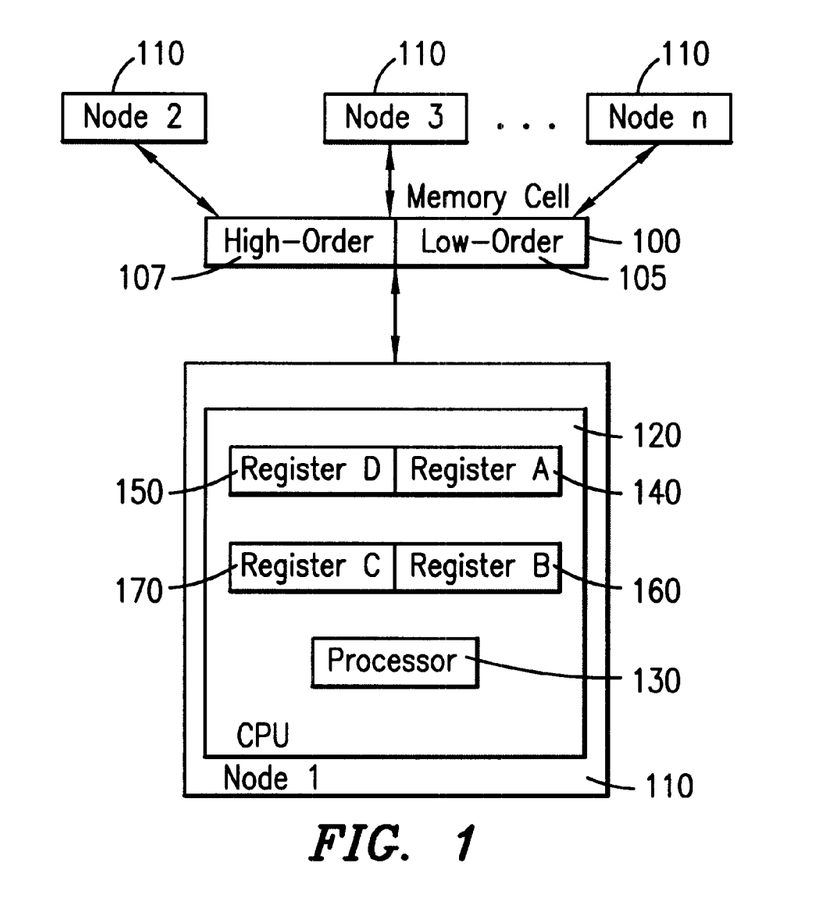
FIG. 1 is a functional block diagram of a computer system including a plurality of processing nodes having access to a shared memory cell.

Referring now to FIG. 1, there is illustrated a computer system including a plurality of processing nodes 110 having access to a shared memory cell 100. The memory cell 100 is partitioned into a low-order data part 105 and a high-order data part 107. For example, in an eight byte memory cell, the low-order data part 105 constitutes a low-order thirty-two bits (i.e. bits zero through thirty-one) while the high-order data part 107 constitutes a high-order thirty-two bits (i.e. bits thirty-two through sixty-three). Each of the processing nodes 110 may operate at various speeds and may be assigned different priorities to access system resources including the memory cell 100. While each of the processing nodes 110 have access to the memory cell 100 the low-order data part 105 and the high-order data part 107 are accessed and/or processed individually. For instance, a communication bus used by the processing nodes 110 to access the memory cell 100 may only have the capacity to communicate either the low-order data part 105 or the high-order data part 107 of the memory cell 100 at one time thereby requiring the processing nodes 10 to access the memory cell 100 twice to retrieve the entire contents of the memory cell 100. In another instance, the communication bus may have the capacity to communicate both the low-order data part 105 and the high-order data part 107 of the memory cell 100 at the same time but the processing nodes 110 may only have a register, used in the read operation, large enough to store either the low-order data part 105 or the high order data part of the memory cell 100. Again, in this instance the processing nodes 110 perform two separate accesses to the memory cell 100 in order to read the entire contents of the memory cell 100.

Each of the plurality of processing nodes 110 include a Central Processing Unit (CPU) 120 comprised of a processor 130, a register A 140, a register B 160, a register D 150 and a register C 170. Register A 140 and register B 160 are each capable of storing the low-order data part 105 of the memory cell 100 while register D 150 and register C 170 are each capable of storing the high-order data part 107 of the memory cell 100. To perform a standard read of memory cell 100 in an environment where the memory cell 100 is not shared by two or more processing nodes 110, the low-order data part 105 is first loaded into register A 140 and then the high-order data part 107 is subsequently loaded into register D 150. Alternatively, the high-order data part 107 is first loaded into register D 150 and then the low-order data part 105 is subsequently loaded into register A 140. In either event, the contents of the memory cell 100 is equal to the value formed by concatenating the contents of register D 150 to register A 120. As previously described, however, a problem arises when a standard read of the memory cell 100 is performed in a shared memory environment.

Since the processing nodes 110 operate asynchronously at different speeds and have different priorities, a first one of the processing nodes 110 may possibly alter the memory cell 100 after a second one of the processing nodes 110 has loaded either the high-order data part 107 into register D 150 or the low-order data part 105 into register A 140 but prior to the second one of the processing nodes 110 having loaded the low-order data part 105 into register A 140 or the high-order data part 107 into register D 150 respectively. Therefore, when register D 150 is concatenated with register A 140 the value which is formed is not equal to the contents of the memory location cell 100.

Figure 2:
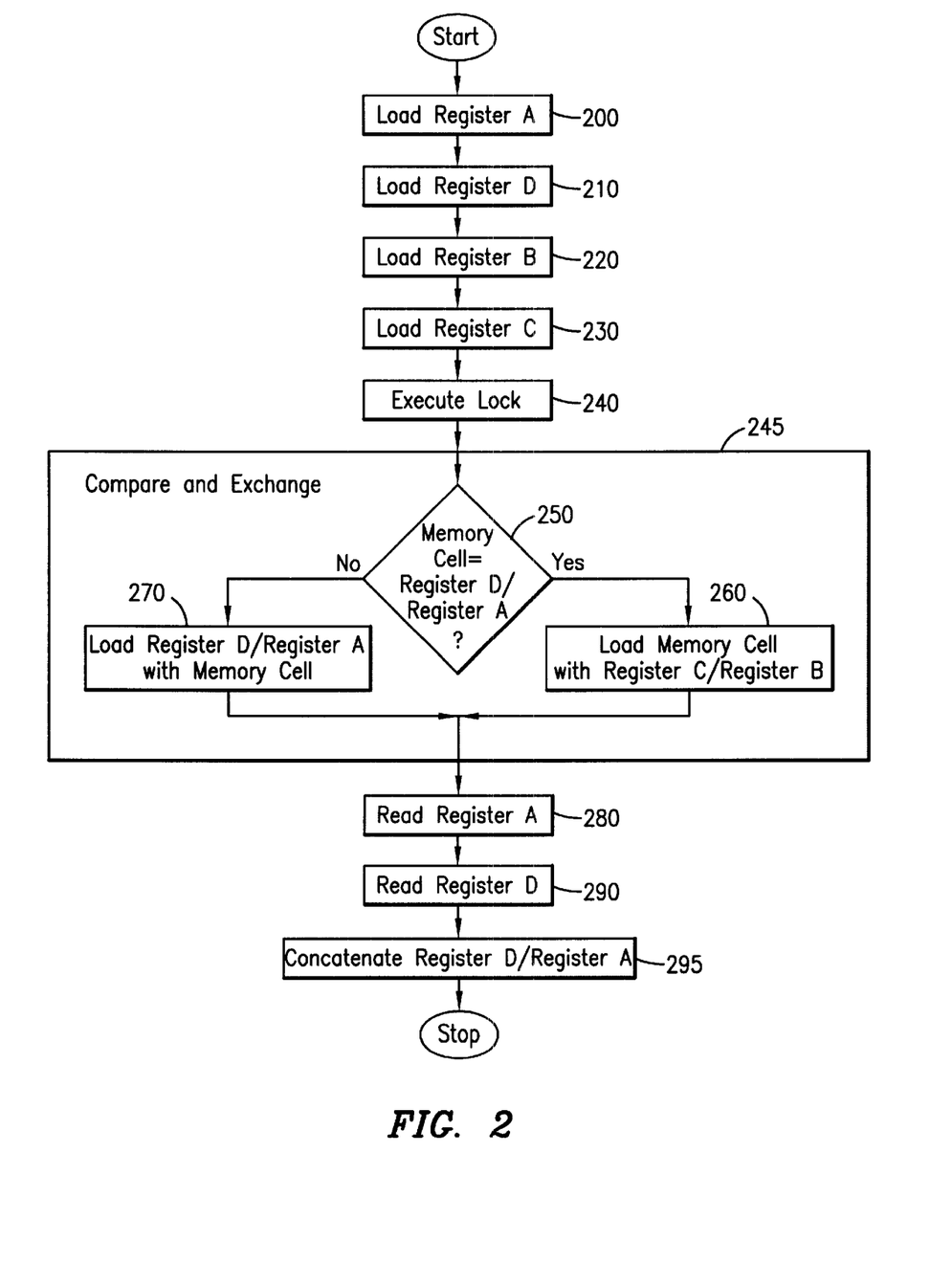
FIG. 2 is a flow diagram of a method for performing an atomic read operation consistent with a first embodiment of the present invention.

Referring additionally now to FIG. 2, there is illustrated a flow diagram of a method for performing an atomic read operation consistent with a first embodiment of the present invention. Register A 140 is loaded with the low-order data part 105 of the memory cell 100 (step 200) and register D is loaded with the high-order data part 107 of the memory cell 100 (step 210). Register B 160 is loaded with the contents of register A 140 (step 220), register C 170 is loaded with the contents of register D 150 (step 230) and a lock operation is executed (step 240).

A compare and exchange operation is preformed on the memory cell 100 (step 245). The compare and exchange operation, step 245, comprises the steps of comparing the contents of the memory cell 100 against the value formed by concatenating the contents of register D 150 with the contents of register A 140 (step 250) and loading the memory cell 100 with the contents formed by concatenating the contents of register C 170 with register B 160 if a match was detected (step 260). Otherwise, if it was determined that the contents of the memory cell 100 did not match the value formed by concatenating the contents of register D 150 with the contents of register A 140 in step 250, register A 140 is loaded with the low-order data part 105 of the memory cell 100 and register D 150 is loaded with the high-order data part 107 of the memory cell 100 (step 270).

The compare and exchange operation is an instruction typically found in modem CPUs. Although step 260 is part of the compare and exchange instruction and is included in the description, it is superfluous to the present invention. Step 260 is included and described in FIG. 2 in order to describe the events which take place in the compare and exchange operation of a modem CPU. Similarly, if step 260 is excluded the loading of register B in step 220 and register C in step 230 is unnecessary and would also be excluded.

After the compare and exchange operation in step 245 is completed, register A 140 is read (step 280) and register D 150 is read (step 290) and the value formed by concatenating the contents of register D 150 with register A 140 (step 295) equals the contents of the memory cell 100. It should be noted that execution of the lock operation in step 240 prevents any of the plurality of processing nodes 110 from altering the contents of the memory cell 100 resulting in an atomic read operation in step 270.

Figure 3:
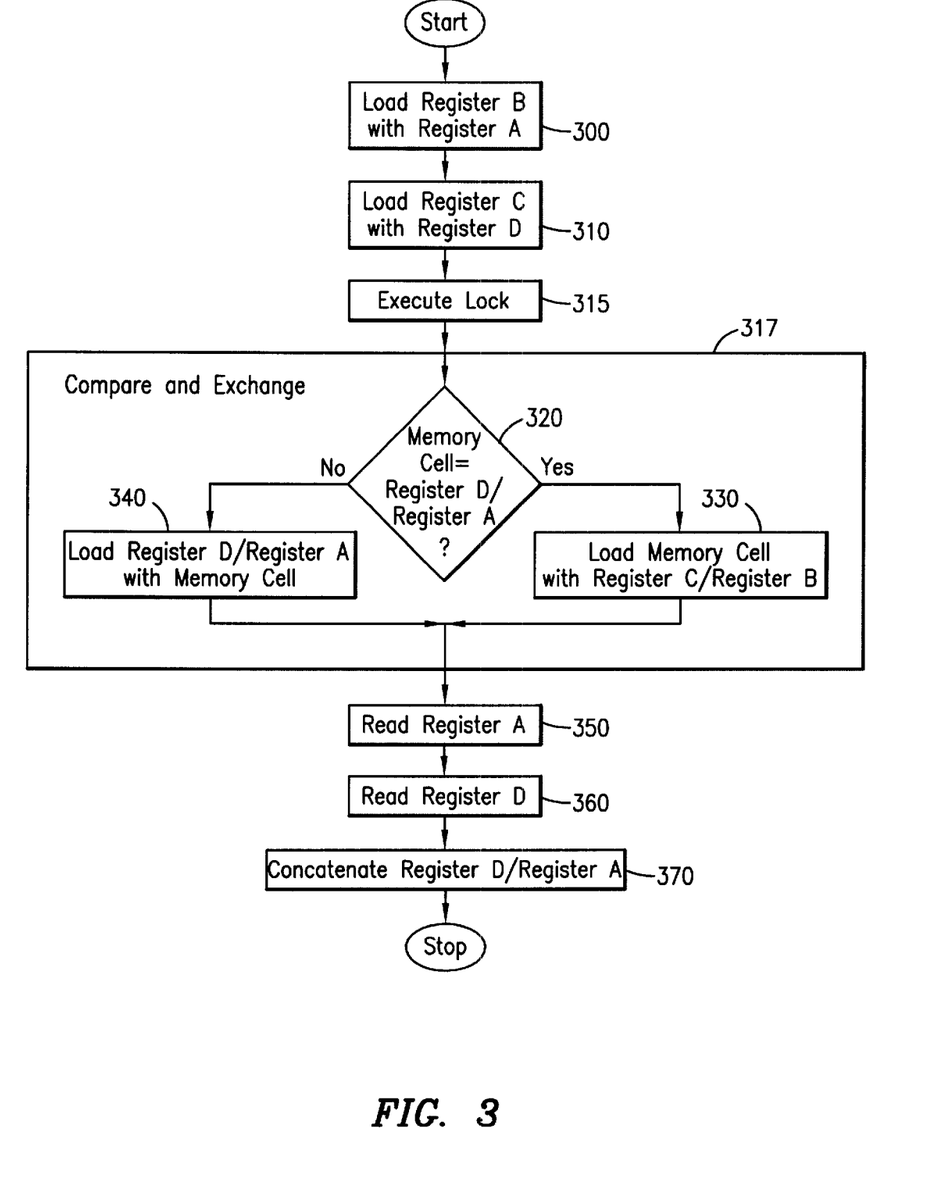
FIG. 3 is a flow diagram of a method for performing an atomic read operation consistent with a second embodiment of the present invention.

Referring additionally now to FIG. 3, there is illustrated a flow diagram of a method for performing an atomic read operation consistent with a second embodiment of the present invention. Register B 160 is loaded with the contents of register A 140 (step 300), register C 170 is loaded with the contents of register D 150 (step 310), a lock operation is executed (step 315) and a compare and exchange operation is preformed on the memory cell 100 (step 317).

The compare and exchange operation, step 317, comprises the steps of comparing the contents of the memory cell 100 against the value formed by concatenating the contents of register D 150 with the contents of register A 140 (step 320) and loading the memory cell 100 with the contents formed by concatenating the contents of register C 170 with register B 160 if a match was detected (step 330). Otherwise, if it was determined that the contents of the memory cell 100 did not match the value formed by concatenating the contents of register D 150 with the contents of register A 140 in step 320, register A 140 is loaded with the low-order data part 105 of the memory cell 100 and register D 150 is loaded with the high-order data part 107 of the memory cell 100 (step 340).

The compare and exchange operation is an instruction typically found in modem CPUs. Although step 330 is part of the compare and exchange instruction and is included in the description, it is superfluous to the present invention. Step 330 is included and described in FIG. 3 in order to describe the events which take place in the compare and exchange operation of a modern CPU. Similarly, if step 330 is excluded the loading of register B in step 300 and register C in step 310 is unnecessary and would also be excluded.

After the compare and exchange operation in step 317 is completed, register A 140 is read (step 350) and register D 150 is read (step 360) and the value formed by concatenating the contents of register D 150 with register A 140 (step 370) equals the contents of the memory cell 100. It should be noted that execution of the lock operation in step 315 prevents any of the plurality of processing nodes 110 from altering the contents of the memory cell 100 resulting in an atomic read operation in step 340.

Figure 4:
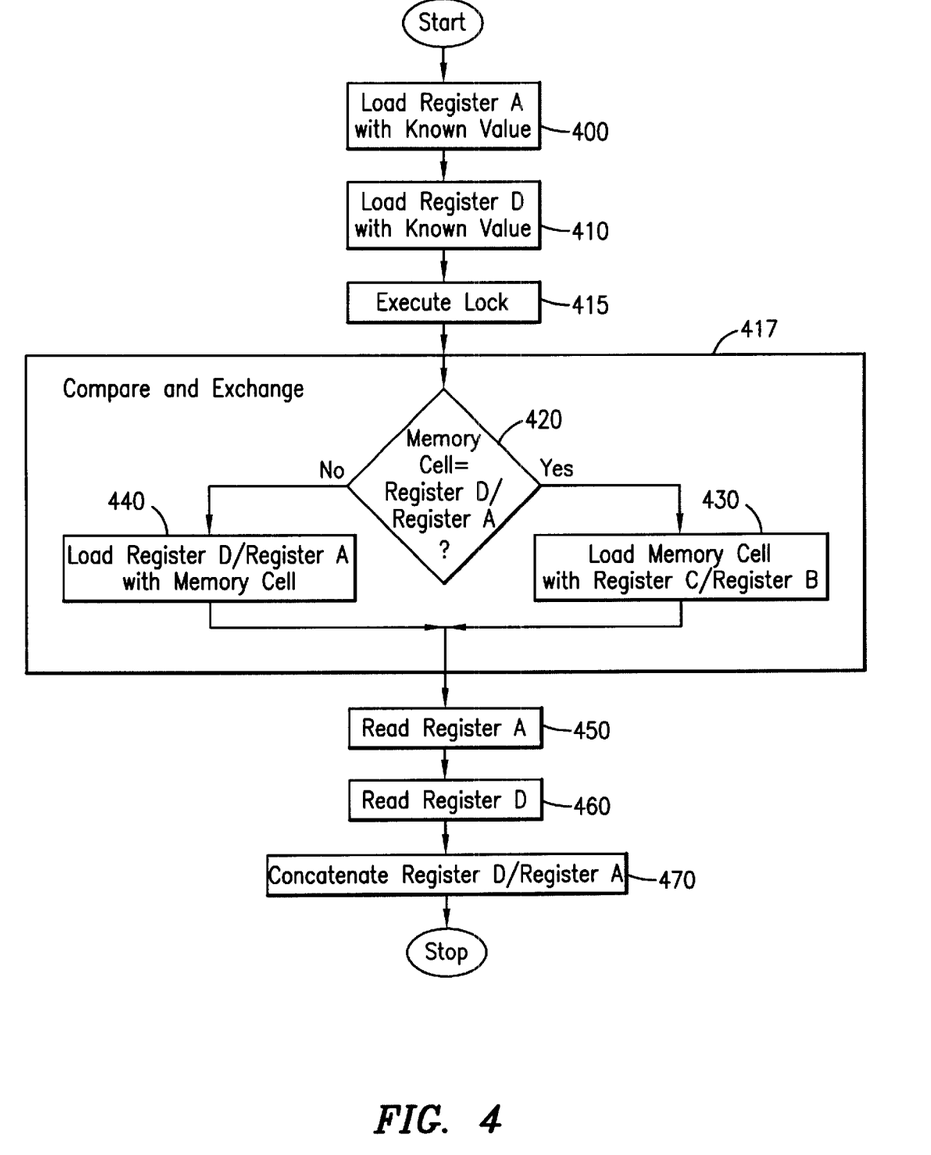
FIG. 4 is a flow diagram of a method for performing an atomic read operation consistent with a third embodiment of the present invention.

Referring additionally now to FIG. 4, there is illustrated a flow diagram of a method for performing an atomic read operation consistent with a third embodiment of the present invention. Register A 140 is loaded with a known value wherein the value is known never to exist in the low-order data part 105 of the memory cell 100 (step 400). Register D 150 is also loaded with a known value wherein the value is known never to exist in the high-order data part 107 of the memory cell 100 (step 410) and a lock operation is executed (step 415).

A compare and exchange operation is preformed on the memory cell 100 (step 417). The compare and exchange operation, step 417, comprises the steps of comparing the contents of the memory cell 100 against the value formed by concatenating the contents of register D 150 with the contents of register A 140 (step 420) and loading the memory cell 100 with the contents formed by concatenating the contents of register C 170 with register B 160 if a match was detected (step 430). Otherwise, if it was determined that the contents of the memory cell 100 did not match the value formed by concatenating the contents of register D 150 with the contents of register A 140 in step 420, register A 140 is loaded with the low-order data part 105 of the memory cell 100 and register D 150 is loaded with the high-order data part 107 of the memory cell 100 (step 440).

After the compare and exchange operation in step 417 is completed, register A 140 is read (step 450) and register D 150 is read (step 460) and the value formed by concatenating the contents of register D 150 with register A 140 (step 470) equals the contents of the memory cell 100. It should be noted that execution of the lock operation in step 415 prevents any of the plurality of processing nodes 110 from altering the contents of the memory cell 100 resulting in an atomic read operation in step 440.

It is understood that while the examples and descriptions provided herein make reference to the memory cell 100 as having the low-order data part 105 representing a high-order thirty-two bit value and the high-order data part 107 representing a low-order thirty-two bit value, the invention is equally applicable to any size memory cell 100 having any number of bits partitioned into any number of data parts. Furthermore, while the examples and descriptions provided herein describe the memory cell 100 as being divided into two equally sized data parts(i.e. data parts 105 and 107), the invention is equally applicable to a memory cell 100. which is divided into a plurality of data parts wherein the data parts have varying sizes.

Although the preferred embodiments of the method of the present invention has been illustrated in the accompanying Drawings and described in the foregoing Detailed Description, it is understood that the invention is not limited to the embodiments disclosed, but is capable of numerous rearrangements, modifications and substitutions without departing from the spirit of the invention as set forth and defined by the following claims.

What is claimed is:

1. A method of manipulating data in a computer system that comprises a plurality of registers and a memory cell, the method comprising the acts of:

executing a lock operation;

comparing contents of at least a portion of the memory cell against a value formed by concatenating contents of the plurality of registers;

loading contents of the at least a portion of the memory cell into the plurality of registers if the value formed by concatenating contents of the plurality of registers is not equal to contents of the at least a portion of the memory cell; and reading the plurality of registers.

2. The method as recited in claim 1, further comprising the act of loading the memory cell with contents of a second plurality of registers if the value formed by concatenating contents of the first plurality of registers is equal to contents of the at least a portion of the memory cell.

3. A method of manipulating data in a computer system having a plurality of registers and a memory cell, the method comprising the acts of:

loading a low-order group of bits from the memory cell into a first register;

loading a high-order group of bits from the memory cell into a second register;

executing a lock operation;

comparing a value contained in the memory cell against a value formed by concatenating a value contained in the second register to a value contained in the first register;

loading the low-order group of bits of the memory cell into the first register if the value contained in the memory cell is not equal to the value formed by concatenating the value contained in the second register to the value contained in the first register; and loading the high-order group of bits of the memory cell into the second register if the memory cell is not equal to the value formed by concatenating the value contained in the second register to the value contained in the first register.

4. The method as recited in claim 3, comprising the acts of:

loading the contents of the second register into a third register;

loading the contents of the first register into a fourth register;

loading the contents of the third register into the high-order bits of the memory cell if the value contained in the memory cell is equal to the value formed by concatenating the value contained in the second register to the value contained in the first register; and loading the fourth register into the low-order bits of the memory cell if the value contained in the memory cell is equal to the formed by concatenating the value contained in the second register to the value contained in the first register.

5. A method for performing an atomic read comprising the steps of:

loading a first known value into Register A wherein, the value is known never to exist in a low-order thirty-two bits of a memory cell;

loading a second known value into Register D wherein, the value is known never to exist in the high-order thirty-two bits of the memory cell;

executing an atomic compare and exchange operation on the memory cell the atomic compare and exchange operation comprising the steps of:

executing a lock operation;

comparing a sixty-four bit value contained in the memory cell against a sixty-four bit value formed by concatenating a thirty-two bit value contained in Register D to a thirty-two bit value contained in Register A;

loading the low-order thirty-two bits of the memory cell into Register A if the sixty-four bit value contained in the memory cell is not equal to the sixty-four bit value formed by concatenating the thirty-two bit value contained in Register D to the thirty-two bit value contained in Register A; and loading the high-order thirty-two bits of the memory cell into Register D if the memory cell is not equal to the sixty-four bit value formed by concatenating the thirty-two bit value contained in Register D to the thirty-two bit value contained in Register A;

reading Register A; and reading Register D.

6. The method as recited in claim 5, further comprising the step of concatenating contents of Register D to Register A.

7. The method as recited in claim 5, further comprising the steps of:

loading Register A into Register B;

loading Register D into Register C;

loading Register C into the high-order thirty-two bits of the memory cell if the sixty-four bit value contained in the memory cell is equal to the sixty-four bit value formed by concatenating the thirty-two bit value contained in Register D to the thirty-two bit value contained in Register A; and loading Register B into the low-order thirty-two bits of the memory cell if the sixty-four bit value contained in the memory cell is equal to the sixty-four bit value formed by concatenating the thirty-two bit value contained in Register D to the thirty-two bit value contained in Register A.

8. A method for performing an atomic read comprising the steps of:

loading Register A into Register B;

loading Register D into Register C;

executing an atomic compare and exchange operation on a memory cell, the atomic compare and exchange operation comprising the steps of:

executing a lock operation;

comparing a sixty-four bit value contained in the memory cell against a sixty-four bit value formed by concatenating, a thirty-two bit value contained in Register D to a thirty-two bit value contained in Register A;

loading the low-order thirty-two bits of the memory cell into Register A if the sixty-four bit value contained in the memory cell is not equal to the sixty-four bit value formed by concatenating the thirty-two bit value contained in Register D to the thirty-two bit value contained in Register A; and loading the high-order thirty-two bits of the memory cell into Register D if the memory cell is not equal to the sixty-four bit value formed by concatenating the thirty-two bit value contained in Register D to the thirty-two bit value contained in Register A;

reading Register A; and reading Register D.

9. The method as recited in claim 8 further comprising the step of concatenating contents of Register D to Register A.

10. The method as recited in claim 8, further comprising the steps of:

loading Register C into the high-order thirty-two bits of the memory cell if the sixty-four bit value contained in the memory cell is equal to the sixty-four bit value formed by concatenating the thirty-two bit value contained in Register D to the thirty-two bit value contained in Register A; and loading Register B into the low-order thirty-two bits of the memory cell if the sixty-four bit value contained in the memory cell is equal to the sixty-four bit value formed by concatenating the thirty-two bit value contained in Register D to the thirty-two bit value contained in Register A.

11. A method for performing an atomic read of a memory cell comprising the steps of:

copying contents of Register A into Register B;

copying contents of Register D into Register C;

executing a lock operation on the memory cell;

comparing the contents of Registers A and D to a value stored in the memory cell;

updating the contents of Registers A and D with the value stored in the memory cell if the contents of Registers A and D are not equal to the value stored in the memory cell;

releasing the lock operation on the memory cell;

reading Register A; and reading Register D.

12. The method as recited in claim 11, wherein the contents of Registers A and D comprise a sixty-four bit value formed by concatenating Register A with Register D, and wherein the value stored in the memory cell comprises a sixty-four bit value.

13. The method as recited in claim 11, wherein copying contents of Register A and copying contents of Register D comprises the steps of:

loading a value into Register A; and loading a value into Register D.

14. The method as recited in claim 13, wherein the value loaded into Register A comprises a first known value known never to exist in the memory cell, and wherein the value loaded into Register D comprises a second known value known never to exist in the memory cell.

15. The method as recited in claim 13, wherein the value loaded into Register A comprises low-order thirty-two bits of the memory cell, and the value loaded into Register D comprises high-order thirty-two bits of the memory cell.

16. The method as recited in claim 11, wherein the step of releasing the lock operation comprises the steps of:

loading contents of Registers B and C into the memory cell if the contents of Registers A and D are equal to the value stored in the memory cell; and loading the updated contents of Registers A and D into the memory cell if the contents of Registers A and D are not equal to the value stored in the memory cell.

17. A method of manipulating data in a computer system that comprises a plurality of registers and a memory cell, the method comprising the acts of:

executing a lock operation; and performing an atomic operation comprising the acts of:

comparing contents of at least a portion of the memory cell against a value formed by concatenating contents of the plurality of registers;

loading contents of the at least a portion of the memory cell into the plurality of registers if the value formed by concatenating contents of the plurality of registers is not equal to contents of the at least a portion of the memory cell.

18. The method as recited in claim 17, further comprising the act of loading the memory cell with contents of a second plurality of registers if the value formed by concatenating contents of the first plurality of registers is equal to contents of the at least a portion of the memory cell.

19. A method of manipulating data in a computer system having a plurality of registers and a memory cell, the method comprising the acts of:

loading a low-order group of bits from the memory cell into a first register;

loading a high-order group of bits from the memory cell into a second register;

executing a lock operation; and performing an atomic operation comprising the acts of:

comparing a value contained in the memory cell against a value formed by concatenating a value contained in the second register to a value contained in the first register;

loading the low-order group of bits of the memory cell into the first register if the value contained in the memory cell is not equal to the value formed by concatenating the value contained in the second register to the value contained in the first register; and         loading the high-order group of bits of the memory cell into the second register if the memory cell is not equal to the value formed by concatenating the value contained in the second register to the value contained in the first register.

20. The method as recited in claim 19, comprising the acts of:

loading the contents of the second register into a third register;

loading the contents of the first register into a fourth register; and     wherein the act of performing an atomic operation comprises the acts of:

loading the contents of the third register into the high-order bits of the memory cell if the value contained in the memory cell is equal to the value formed by concatenating the value contained in the second register to the value contained in the first register; and         loading the fourth register into the low-order bits of the memory cell if the value contained in the memory cell is equal to the formed by concatenating the value contained in the second register to the value contained in the first register.

* * * * *